(12) United States Patent
Schwesig

(10) Patent No.: US 8,138,767 B2
(45) Date of Patent: Mar. 20, 2012

(54) TRANSMISSIVITY MONITORING OF AN ENERGY TRANSMISSION ELEMENT

(75) Inventor: Günter Schwesig, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 373 days.

(21) Appl. No.: 12/519,575

(22) PCT Filed: Dec. 17, 2007

(86) PCT No.: PCT/EP2007/064085
§ 371 (c)(1),
(2), (4) Date: Jun. 17, 2009

(87) PCT Pub. No.: WO2008/077841
PCT Pub. Date: Jul. 3, 2008

(65) Prior Publication Data
US 2010/0039096 A1    Feb. 18, 2010

(30) Foreign Application Priority Data
Dec. 21, 2006    (DE) .......................... 10 2006 060 778

(51) Int. Cl.
G01R 29/00    (2006.01)

(52) U.S. Cl. .......................... 324/612; 324/516; 324/518

(58) Field of Classification Search .................. 324/516, 324/518, 612, 500
See application file for complete search history.

(56) References Cited

U.S. PATENT DOCUMENTS
4,056,771 A * 11/1977 Clinton et al. ................ 324/516

FOREIGN PATENT DOCUMENTS
| | | |
|---|---|---|
| EP | 1 143 254 A1 | 10/2001 |
| FR | 2 791 190 A1 | 9/2000 |
| WO | WO 2005/062432 A1 | 7/2005 |

* cited by examiner

*Primary Examiner* — Vincent Q Nguyen

(57) ABSTRACT

A method for monitoring transmissivity of an energy transmission element for a protective earth conductor and an electrical machine with such transmissivity monitoring are provided. For a cost-effective solution for transmissivity monitoring, the protective earth conductor of a first circuit is connected on a first side of the energy transmission element via a connecting line to a ground of a second circuit wherein a potential-free voltage supply is connected between the protective earth conductor and ground on a second side of the energy transmission element. A current flows through the energy transmission element and the connecting line that is produced by the potential-free voltage supply. The transmissivity of the energy transmission element is monitored using the current flow by a monitoring element which is arranged between the protective earth conductor and ground on the second side of the energy transmission element.

12 Claims, 1 Drawing Sheet

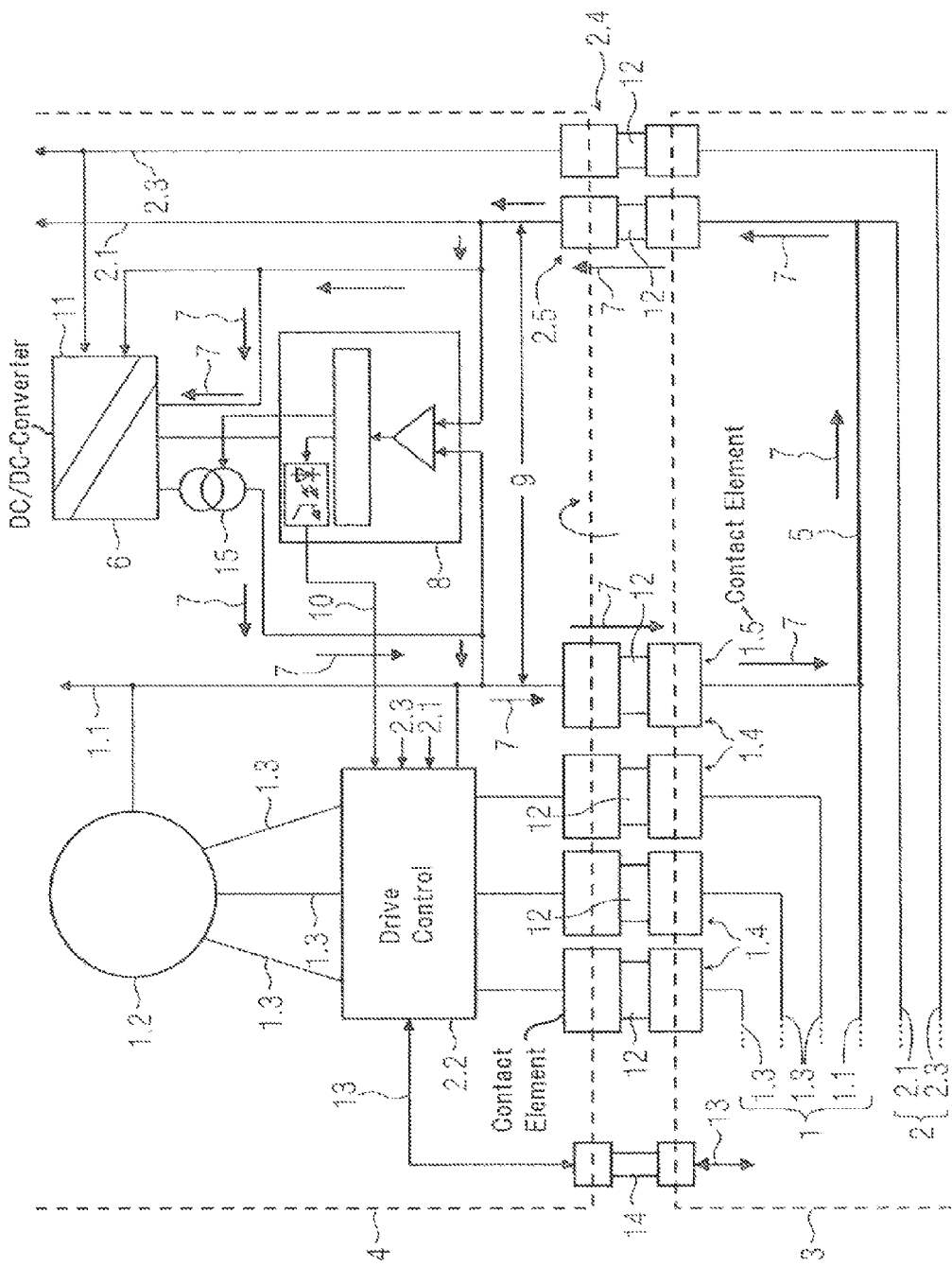

TRANSMISSIVITY MONITORING OF AN ENERGY TRANSMISSION ELEMENT

CROSS REFERENCE TO RELATED APPLICATIONS

This application is the US National Stage of International Application No. PCT/EP2007/064085, filed Dec. 17, 2007 and claims the benefit thereof. The International Application claims the benefits of German application No. 10 2006 060 778.3 filed Dec. 21, 2006, both of the applications are incorporated by reference herein in their entirety.

FIELD OF THE INVENTION

The invention relates to a method for transmissivity monitoring of an energy transmission element for a protective earth conductor and to an electrical machine with such transmissivity monitoring.

BACKGROUND OF THE INVENTION

Such a method is employed especially in machine tools and production machines such as multi-spindle automatic turning machines and rotary transfer machines, in which electric motors (preferably polyphase machines) are arranged on a rotationally moving machine part. The drive regulation and also the power electronics (line-commutated converter, self-commutated converter or unregulated DC converter and the AC power converter or converters) for driving the motors are generally arranged in a switching cabinet. The power lines and if necessary encoder lines (encoders in the motor for position and speed detection) are routed out of the cabinet to the motors. However the lines very quickly wear out as a result of the permanent bending and torsion stresses, with replacement of the lines being rendered very expensive by the mostly complex machine construction. In addition when using lines for energy transmission (i.e. especially between a fixed and rotationally-moving machine part) no "infinite rotation" of the moving machine part for further reduction of workpiece processing times is possible.

The function "infinite rotation" is currently becoming ever more attractive and there are already machines with this function. In such cases either the direct current and alternating current converter or only the alternating current converter are arranged on the moving machine part. The energy is accordingly transmitted as a two-phase DC voltage or three-phase AC voltage (mains voltage). The energy is currently preferably transmitted via slip rings, since inductive transmission means a significant additional outlay in electronics (as regards costs, installation volume and heat removal) including transformers (rotary transformers). A further variant is known from WO 2005/062432 A1 in which, instead of the conventional copper slip ring contacts, liquid metal alloys are used. With both variants the primary expense and cost factor is the number of energy transmission elements.

In accordance with the electrical regulations the protective earth conductor of a protective earth conductor system (for driving the motors) is to be additionally connected to the moving machine part and to the electronics located on it. According to EN 60204-1 (13.8.2 protective earth conductor circuit) the transmissivity of the protective earth circuit via sliding contacts must be guaranteed by the use of suitable measures (e.g. duplication of the current pickups, transmissivity monitoring). Thus either a transmissivity monitoring is necessary or two energy transmission elements are required for the protective earth conductor. In such cases these energy transmission elements must be designed in accordance with the operating current or regulations. (The outlay required for an energy transmission element with 200 A current carrying capacity is appr. €2000.00.)

SUMMARY OF THE INVENTION

The underlying object of the invention is to specify a cost-effective solution for transmissivity monitoring for an energy transmission element for a protective earth conductor.

The object is achieved by a method for transmissivity monitoring of an energy transmission element for a protective earth conductor in a first electrical circuit, with the protective earth conductor being connected on a first side of the energy transmission element via a connecting line to a ground of the second electrical circuit, with a potential-free power supply between protective earth conductor and ground being connected on a second side of the energy transmission element, with a current flow through the energy transmission element and the connecting line being generated by means of the potential-free power supply and with the transmissivity of the energy transmission element being monitored on the basis of the current flow generated by the potential-free power supply by means of a monitoring element arranged between protective earth conductor and ground on the second side of the energy transmission element.

The object is further achieved by an electrical machine with the features specified in the claims.

The inventive solution makes use of the fact that, in addition to the power supply for the motor (first electrical circuit with protective earth conductor), a second electrical circuit (with a ground) is provided for the electronics such as drive regulation, sensor systems, actor systems etc. The fact that the ground is earthed via a protective earth conductor means that precisely this protective earth conductor-ground connection offers the opportunity with a minimal additional outlay for a transmissivity monitoring of the energy transmission element for the protective earth conductor: Only one further voltage supply for the generation of a "test current" as well as said monitoring element on the side of the energy transmission element opposite to the protective earth conductor-ground connection is thus needed. This "test current" flows of via the energy transmission element for the protective earth conductor, via the connecting line between protective earth conductor and ground and via the energy transmission element for the ground—necessarily present for the "infinite rotation" function but which does not necessarily have to be tested—back to the voltage or current source. In such cases the test current—as is also required by the specifications—does not flow via the protective earth conductor per se but only partially in the area of the energy transmission element via the protective earth conductor. The current flow via the protective earth conductor-ground connection (and the energy transmission element for the ground) enables the inventive method to simultaneously also check the correct connection between protective earth conductor and ground. For checking the transmissivity or low resistance with an impressed voltage the current can be detected by the transmission element for example. This electronic transmissivity monitoring means that, in compliance with the regulations for an energy transmission via a slip ring for example or a slip line, only one energy transmission element is required for the protective earth conductor. By using the protective earth conductor-ground connection this solution is also able to be implemented with little outlay and thus cost effectively.

In an advantageous embodiment, to determine the transmissivity of the energy transmission element by means of the monitoring element, a voltage drop between protective earth conductor and ground is measured. This can be easily achieved by a test current impressed by a current source fed by a potential-free power supply, with the transmissivity or low resistance being checked by detecting the corresponding voltage drop.

In a further advantageous embodiment a warning signal is output when a first threshold value for the transmissivity is reached. In such cases this warning signal can be output via a communication to a higher-ranking controller at which the error can be displayed.

In a further advantageous embodiment, when a second threshold value for the transmissivity is reached, the first electrical circuit is interrupted. This means for example that a motor is brought to a stop if the transmissivity of the energy transmission element is no longer guaranteed for the protective earth conductor. In this case the second threshold value can also correspond to the first threshold value of the previous exemplary embodiment.

In a further preferred exemplary embodiment the potential-free power supply will be generated from the second electrical circuit via a DC converter. In this way an additional power supply such as a battery for example is dispensed with for the transmissivity monitoring.

In a further advantageous embodiment the transmissivity monitoring is conducted over two channels. The reliability of the method is enhanced by this redundant realization.

In a further advantageous embodiment the transmissivity monitoring is executed in this case with forced offline checking. This ensures that even sleeping errors in a redundant branch will be found.

In a further advantageous embodiment the energy is transmitted in the energy transmission element via a slip ring and/or liquid metal. The current is usually supplied to the rotating part via slip rings. These slip rings are subject to mechanical friction i.e. wear. For energy transmission via liquid metal a current transmission surface is provided on the fixed part and on the rotating part opposite to this part in each case, with the two current transmission surfaces forming a gap between them, into which the fluid metal alloy is introduced. This creates an electrical contact and at the same time does not adversely affect the ability of the rotating part to rotate in relation to the fixed part. In addition the energy transmission element can also be designed redundantly to enhance the reliability—albeit at the expense of cost savings.

In a further exemplary embodiment the first electrical circuit is designed for a three-phase AC voltage. Thus, in addition to the protective ground conductor, three further conductors are to be provided with associated energy transmission elements for the first electrical circuit. This embodiment, which is particularly suitable for AC motors, only requires one additional AC converter for the power electronics, which is located on the rotating part.

In a further advantageous embodiment the second electrical circuit is designed as a PELV electrical circuit. PELV (Protective Extra Low Voltage), previously "low functional voltage with secure connection", is a protective measure in which active parts and housings of a device may be grounded and connected to a protective earth conductor. "Secure disconnection" in this case means that primary and secondary electrical circuit of the transformer must be separated by a doubled or enhanced insulation. The highly reliable rated voltage amounts to a maximum of 50 V with AC power and 120 V with DC power. A PELV electrical circuit is thus very well suited as a second circuit for feeding the electronics (for drive control, sensor systems and actor systems for example) with 24 V (direct current).

BRIEF DESCRIPTION OF THE DRAWINGS

The invention is described in more detail and explained below with reference to the exemplary embodiment shown in the FIGURE.

The FIGURE shows a schematic circuit diagram with the most important elements for explaining the inventive method for transmissivity monitoring.

DETAILED DESCRIPTION OF THE INVENTION

Shown in the figure is an electric machine with a fixed part 3 and a rotating part 4 opposite said fixed part on which a first electrical load 1.2, for example a motor, is located which is fed via a first electrical circuit 1 from power lines 1.3 and a protective earth conductor 1.1. The power lines 1.3 shown correspond to the conductors of a three-phase AC power network and, like the protective earth conductor 1.1 are routed via energy transmission elements 1.4, 1.5, which allow an "infinite rotation" of the rotating part 4, to the fixed part 3. The energy transmission elements 1.4, 1.5 as shown are contact elements 1.4, 1.5 with fluid metal 12, but with the contact elements 1.4, 1.5 could also be conventional slip contacts/rings. The motor 1.2 is controlled via a drive control 2.2 (with power electronics) which represents a second electrical load, which is supplied via a second electrical circuit 2 from a 24 V conductor 2.3 and a ground 2.1 with 24 V DC voltage. The drive control 2.2 is connected via a communication link 13 to a higher-ranking controller (e.g. a PLC, not shown), with the signals of the communication link 13 being transmitted from the rotating part 4 to the fixed part 3 of the machine by a signal transmission element 14 which can also be realized inductively or optically.

The second electrical circuit 2 is, on the fixed part 3 of the machine, earthed via a connecting line 5 connecting the ground 2.1 and the protective earth conductor 1.1 of the first electrical circuit 1. The connections between fixed part 3 and rotating part 4 are also realized in the second electrical circuit 2 via energy transmission elements 2.4, 2.5.

For transmissivity monitoring, a current flow 7 is generated on the rotating part 4 of the machine, by a potential-free power supply 6. In the exemplary embodiment as shown the potential-free voltage is generated from the 24 V voltage of the second electrical circuit 2 via a DC/DC converter 11, which feeds a current source 15, which generates a defined test current 7. This test current 7 flows out of the current source 15 via the energy transmission element 1.5 for the protective earth conductor 1.1, via the connecting line 5 on the fixed part 3 between the protective earth conductor 1.1 and ground 2.1, and via the energy transmission element 2.5 for the ground 2.1 back to the current source 15. The voltage drop 9 at the two energy transmission elements 1.5, 2.5 is observed via a transmission element 8. If the voltage drop 9 exceeds a first threshold value, a warning signal 10 is output to the drive control 2.2. Via the communication link 13 to the higher-ranking controller, the error can be displayed. If the voltage drop 9 exceeds a second threshold value, which can be identical to the first threshold value, the motor 1.2 is stopped.

In summary the invention relates to a method for transmissivity monitoring of an energy transmission element for a protective earth conductor as well as to an electrical machine with such transmissivity monitoring. For a low-cost solution for transmissivity monitoring a method is proposed whereby the protective earth conductor of a first electrical circuit is connected on a first side of the energy transmission element via a connecting line to a ground of a second electrical circuit, whereby on a second side of the energy transmission element a potential-free power supply is connected between protective earth conductor and ground, whereby by means of the potential-free power supply a current flow through the energy transmission element and the connecting lead is generated and whereby by means of a monitoring element arranged between the protective earth conductor and ground on the second side of the energy transmission element, the transmissivity of the energy transmission element is monitored on the basis of the current flow generated by the potential-free power supply.

The invention claimed is:

1. A method for monitoring a contact element for a protective earth conductor in a first electrical circuit, comprising:
    providing an electric machine with a fixed part and a rotating part;
    providing a contact element, wherein the contact element is connected both to the fixed part and the rotating part of the electric machine;
    providing a first electrical circuit and a second electrical circuit;
    connecting the protective earth conductor to a ground of the second electrical circuit via a connecting line on the fixed part of the electric machine;
    connecting a potential-free power supply between the protective earth conductor and the ground on the rotating part of the electric machine;
    generating a flow of current through the contact element and the connecting line by the potential-free power supply;
    arranging a monitoring element between the protective earth conductor and the ground; and
    monitoring the contact element based on the flow of current by the monitoring element.

2. The method as claimed in claim 1, wherein a voltage drop between the protective earth conductor and the ground is measured by the monitoring element to determine a transmissivity of the contact element.

3. The method as claimed in claim 1, wherein a warning signal is output when the transmissivity reaches a first threshold value.

4. The method as claimed in claim 1, wherein the first electrical circuit is interrupted when the transmissivity reaches a second threshold value.

5. The method as claimed in claim 1, wherein the potential-free power supply is generated from the second electrical circuit via a DC-DC converter.

6. The method as claimed in claim 1, wherein the transmissivity monitoring is executed on two channels.

7. The method as claimed in claim 6, wherein the transmissivity monitoring is executed with forced offline checking.

8. The method as claimed in claim 1, wherein the contact element transmits energy via a slip ring.

9. The method as claimed in claim 1, wherein the contact element transmits energy via a liquid metal.

10. The method as claimed in claim 1, wherein the first electrical circuit is a three-phase AC voltage circuit.

11. The method as claimed in claim 1, wherein the second electrical circuit is a protective extra low voltage electrical circuit.

12. An electrical machine, comprising:
    a fixed part;
    a rotating part that rotates in relation to the fixed part;
    a first electrical circuit with a protective earth conductor that supplies a first electrical load on the rotating part;
    a second electrical circuit with a ground that supplies a second electrical load on the rotating part for controlling the first electrical load;
    a contact element that transmits energy between the fixed part and the rotating part;
    a connecting line that connects the protective earth conductor to the ground on the fixed part;
    a potential-free power supply arranged between the protective earth conductor and the ground on the rotating part that generates a flow of current through the contact element and the connecting line; and
    a monitoring element arranged between the protective earth conductor and the ground that monitors a transmissivity of the contact element based on the flow of current.

* * * * *